United States Patent [19]

Hasegawa et al.

[11] 4,304,838

[45] Dec. 8, 1981

[54] PHOTOPOLYMERIZABLE COMPOSITION AND RECORDING MATERIALS UTILIZING THE SAME

[75] Inventors: Eiichi Hasegawa; Hisatake Ono; Shigeo Tanaka, all of Asaka, Japan

[73] Assignee: Fuji Photo Film Co., Ltd., Minami-ashigara, Japan

[21] Appl. No.: 834,020

[22] Filed: Sep. 16, 1977

Related U.S. Application Data

[63] Continuation of Ser. No. 634,707, Nov. 24, 1975, abandoned, which is a continuation-in-part of Ser. No. 455,087, Mar. 27, 1974, abandoned.

[30] Foreign Application Priority Data

Mar. 27, 1973 [JP] Japan .................................. 48-35377

[51] Int. Cl.$^3$ ............................................. G03C 11/12

[52] U.S. Cl. ................................... 430/253; 430/271; 430/273; 430/281; 430/288; 430/907; 204/159.18; 204/159.15; 204/159.17; 204/159.23

[58] Field of Search ....................... 96/115 R, 115 P; 430/253, 271, 231, 273, 286, 287, 288, 907; 204/159.15, 159.17, 159.18, 159.23

[56] References Cited

U.S. PATENT DOCUMENTS 3,713,831  1/1973  Hayes et al. ...................... 96/115 R
3,867,153  2/1975  MacLachlan ...................... 96/115 R

*Primary Examiner*—Jack P. Brammer
*Attorney, Agent, or Firm*—Sughrue, Mion, Zinn, Macpeak and Seas

[57] ABSTRACT

A photopolymerizable composition comprising (a) a chlorinated polyolefin, (b) a monomer having at least one ethylenically unsaturated bond capable of addition polymerization and (c) a photopolymerization initiator.

42 Claims, No Drawings

PHOTOPOLYMERIZABLE COMPOSITION AND RECORDING MATERIALS UTILIZING THE SAME

CROSS-REFERENCE TO RELATED APPLICATIONS

This is a continuation of co-pending application Ser. No. 634,707, filed Nov. 24, 1975, now abandoned, which is in turn a continuation-in-part application of co-pending application Ser. No. 455,087, filed Mar. 27, 1974, now abandoned.

BACKGROUND OF THE INVENTION

1. Field of the Invention

This invention relates to a photopolymerizable composition comprising a chlorinated polyolefin as polymeric binder, a monomer having one unsaturated olefinic bond capable of addition polymerization and an initiator promoting the photopolymerization of the monomer. This invention also relates to recording materials prepared by coating on a plastic film support a layer of the photopolymerizable composition and further, if desired, providing a protective plastic film over this layer.

2. Description of the Prior Art

Photopolymerizable compositions, utilized in photo resists, offset plate masters, relief printing plates, transfer type photopolymerizable materials and, moreover, recording materials such as "Crolux", trade name, produced by E. I. DuPont de Nemours, which is based on a photoadhesion phenomenon, usually comprise (a) a polymeric material as a binder, (b) a monomer having an ethylenically unsaturated linkage, (c) an initiator for photopolymerization, and other ingredients. Some specific compositions are disclosed, for example, in the following patent specifications; Japanese Patent Publication No. 16614/1960, Japanese Patent Publication No. 15810/1963, and Japanese Patent Publication No. 9663/1963 and U.S. Pat. No. 3,353,955. Here, the monomer having an unsaturated double bond functions, prior to exposure to radiation, as a plasticizer or a tackifier for the polymeric binder used, and upon exposure to actinic radiation forms three-dimensional cross-linkages, thus losing its previous plasticizing or tackifying characteristics. Therefore, how well the monomer can exhibit its intrinsic properties depends to a great extent on the kind, the properties or the mixing ratio of the polymer binder.

Especially, where a photopolymerizable composition is used for the preparation of a printing plate, the composition must exhibit, first of all, a sufficiently high photosensitivity for practical applications. However, from the practical point of view, other characteristics are also quite important including the oleophilic nature of the image area (in other words, the degree of hydrophilicity in the background area), the ease with which the developing operation can be carried out, and a high resolving power. If the resolving power is rather poor, the middle portion of the English letter "o" or "e" will be filled in, which cannot be permitted in the printing master. Considering these aspects, the interaction between the polymer binder and the monomer is very significant.

Further, in the case of a transfer type photopolymerizable recording material, in addition to an acceptable level of polymerization speed, a distinct difference must be developed in the exposed and non-exposed areas in some physical property, for example, such as softening point, adhesive property or hue (color formation or color fading). Such a difference in a physical property results at the subsequent transfer procedure in an imagewise transfer either of the exposed or non-exposed area onto a receiving material. In the transfer procedure, the system may be heated, if necessary.

Recently, a recording process has been developed in which the difference in the surface tackiness of a photopolymer layer at the exposed and non-exposed areas is detected by dusting a finely-divided coloring powder (for example, a toner powder) to provide proofs for multi-color printing. In these applications as in the preparation of the printing plate, the selection and combination of a polymer material as the binder and of the monomer used is quite important in order to increase the difference in properties between the exposed and non-exposed areas.

On the other hand, image forming processes are known as described in detail in some patent specifications including Japanese Patent Publication Nos. 9663/1963 and 7728/1972 and U.S. Pat. No. 3,353,955 wherein an image is obtained by the use of a difference in adhesive properties at the exposed and non-exposed areas. This method, using a recording material prepared by providing a photosensitive layer mainly comprising as components a polymeric binder, an ethylenically unsaturated monomer and a photopolymerization initiator as described above on a support such as a plastic film, a metal plate or a paper, and then placing a thin transparent film over this layer, comprises: an image exposure through an original from above the film, and a peeling-off of the film whereby either the exposed or non-exposed area of the photosensitive layer stays unchanged on the support and the complementary, remaining area is transferred or held on the cover film, thus giving a negative and positive image on each of the support and the cover. In this process, a separation of the photosensitive layer essentially takes place at the boundaries between the exposed and non-exposed areas. The mechanical properties related with such a phenomenon primarily depend on those of the polymer binder and of the monomer used in the layer. The most important factors are the molecular weight, the softening point, the degree of crystallinity, the compatibilities with other materials, and the adhesion strength to the support of the polymer binder used. The resulting image, which will subsequently be utilized for various applications, further should meet certain requirements depending on the end use application, such as resistance to abrasion, chemicals and to weathering, etc.

The importance of the properties of the ingredients used in the recording materials comprising a polymer binder, an ethylenically unsaturated monomer and a polymerization initiator has been explained. However, most materials already known in the art do not at present completely satisfy all the requirements described above, and exhibit a rather poor image forming capability. In Japanese Patent Publication 9663/1963, polymer materials are disclosed as binder which can also impart tackiness to the recording layer. The materials disclosed include polyvinylbutyral, polyvinyl acetate, polyvinylpyrolidone, gelatin, coumarone-indene resins, silicone resins, rubbers, etc. Also, Japanese Patent Publication 7728/1972 discloses that polymers such as vinylidene chloride copolymers, cellulose esters, synthetic rubbers, polyvinyl acetate, polyalkyl acrylates, polyvinylchloride, etc. can be used as a binder. However, according to our experimental evaluations, combinations of these polymers with a variety of monomers and of polymerization initiators failed to give satisfactory results. Especially, with respect to polyvinyl chloride, U.S. Pat. Nos. 3,867,153 (MacLachlan) and 3,261,686 (Celeste et al) disclose that polyvinyl chloride are used in combination with monomer for light sensitive materials. However, from the results of our detailed experiment, as polyvinyl chloride has defects that polyvinyl chloride has poor compatibility with monomer, furthermore, there is a few organic solvents capable of dissolving polyvinyl chloride so that kind of the organic solvent is limited, it is clear that polyvinyl chloride is very unsuitable for the effective use as the binder of photopolymerization composition.

SUMMARY OF THE INVENTION

The inventors, as a result of extensive research to improve the disadvantages in conventional technology, have found that chlorinated polyolefins have an excellent property as a binder polymer. Thus, a principal object of the present invention is to provide a photopolymerizable composition comprising (a) a chlorinated polyolefin, (b) a monomer having an ethylenically unsaturated bond capable of addition polymerization and (c) a photopolymerization initiator.

DETAILED DESCRIPTION OF THE INVENTION

The chlorinated polyolefins which can be used in the present invention are high molecular weight compounds obtained by chlorination of polyolefins and are described in Japanese Patent Publication 11190/1971, etc. Of the many chlorinated polyolefins which can be used in the present invention, chlorinated polyethylene, chlorinated polypropylene and chlorinated copolymer of poly(ethylene/propylene) are most preferred. Chlorinated polyethylene is commercially available as Superchlon-CPE (trade name, produced by Sanyo Kokusaku Pulp Co.) or Erathrene (trade name, produced by Showa Denko Co.), and can be regarded as a new plastic material, since it has unique features as to weather-resistance, thermal resistance, flame resistance, chemical resistance, ozone resistance, etc., as well as other features which conventional polymer materials possess. A commercially available example of chlorinated polypropylene is Superchlon-CPP (trade name, produced by Sanyo Kokusaku Pulp Co.). The properties of this product are quite similar to those of chlorinated polyethylene. Both compounds have a white powdery appearance. The chlorinated polyolefins used in the present invention should have a degree of polymerization ranging from about 300 to 20,000, and more preferably from about 1,000 to 8,000. The chlorine content can be from about 20 to 80% by weight, more preferably being from 50 to 75% by weight. As the chlorine content of a chlorinated polyolefin increases, its density increases and the solubility in various solvents improves. In addition, the chlorine content affects the softening point, the tensile elongation, the tensile strength, the degree of crystallinity, etc. It should be noted that chlorinated polyolefins are superior in compatibility with many other resins, plasticizers, monomers, polymerization initiators, etc.

As for component (b) of the present invention, any monomer can be used, provided that it has at least one unsaturated bond which is capable of addition polymerization. Such unsaturated compounds capable of addition polymerization include, for example, acrylic acid esters, acrylamide compounds, methacrylic acid esters, vinyl ethers, allylic compounds, vinyl esters, N-vinyl compounds, styrene compounds, crotonic acid esters, etc.

Compounds having one unsaturated bond capable of addition polymerization include acrylic acid compounds such as, for example, acrylic acid, alkyl acrylates (e.g., propyl acrylate, butyl acrylate, amyl acrylate, ethylhexyl acrylate, octyl acrylate, t-octyl acrylate, chloroethyl acrylate, hydroxyethyl acrylate, hydroxypropyl acrylate, 2,2-dimethylhydroxypropyl acrylate, 5-hydroxypentyl acrylate, diethylene glycol monoacrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, etc.), or aryl acrylates (e.g., phenyl acrylate, chloro phenyl acrylates, etc.); methmethacrylic acid compounds such as methacrylic acid, alkyl methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, N-ethyl-N-phenylaminoethyl methacrylate, ethyleneglycol monomethacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, 2,2-dimethyl-3-hydroxypropyl methacrylate, diethyleneglycol monomethacrylate, trimethylolpropane monomethacrylate, pentaerythritol monomethacrylate, glycidyl methacrylate, furfuryl methacrylate, tetrahydrofurfuryl methacrylate, etc.), or aryl methacrylates (e.g., phenyl methacrylate, cresyl methacrylate, naphthyl methacrylate, etc.); acrylamide compounds such as, for example, acrylamide, N-alkylacrylamides containing methyl, ethyl, propyl, butyl, t-butyl, heptyl, octyl, cyclohexyl, benzyl, hydroxymethyl, hydroxyethyl, etc. groups as alkyl group, N,N-dialkylacrylamides containing methyl, ethyl, butyl, isobutyl, ethylhexyl, cyclohexyl, etc. groups as alkyl groups, N,N-diarylacrylamides containing as the aryl group, for example, phenyl groups, N-methyl-N-phenylacrylamide, N-hydroxyethyl-N-methylacrylamide, or N-2-acetamidoethyl-N-acetylacrylamide; methacrylamide compounds such as methacrylamide, N-alkylmethacrylamides having methyl, ethyl, t-butyl, ethylhexyl, hydroxyethyl, cyclohexyl, etc. groups as alkyl group, N-arylmethacrylamides having a phenyl group as the aryl group, N,N-dialkylmethacrylates having ethyl, propyl, butyl, etc. as the alkyl groups, N,N-diarylmethacrylamides having phenyl groups as the aryl group, for example, N-hydroxyethyl-N-methyl methacrylamide, N-methyl-N-phenyl methacrylamide, N-ethyl-N-phenyl methacrylamide, etc.; allyl compounds such as, for example, allyl esters (e.g., allyl acetate, allyl caproate, allyl caprylate, allyl laurate, allyl palmitate, allyl stearate, allyl benzoate, allyl acetoacetate, or allyl lactate) or 2-allyloxyethanol; vinyl ethers such as alkyl vinyl ethers (for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethyl butyl ether, hydroxyethyl vinyl ether, diethyleneglycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (for example, vinyl phenyl ether, vinyl tolyl ether, vinyl chlorophenyl ether, vinyl 2,4-dichlorophenyl ether, vinyl naphthyl ether, vinyl anthranyl ether, etc.); vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl lactate, vinyl-β-phenyl butyrate, vinyl cyclohexylcarboxylate, vinyl benzoate, vinyl salicylate, vinyl chlorobenzoate, vinyl tetrachlorobenzoate, vinyl naphthenate; N-vinyl compounds such as, for example, N-vinyloxazolidone, N-vinylimidazole, N-vinylpyrrolidone, N-vinylcarbazole, or N-vinylethylacetamide; styrene compounds such as styrene, alkylstyrenes (e.g., methylstyrene, dimethylstyrene, trimethylstyrene, ethylstyrene, diethylstyrene,, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.), alkoxystyrenes (e.g., methoxystyrene, 4-methoxy-3-methylstyrene, dimethoxystyrene, etc.), halogenated styrenes (e.g., chlorostyrene, dichlorostyrene, trichlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), or carboxystyrenes (e.g., vinylbenzoic acid, methyl vinylbenzoate, etc.); or crotonic acid esters such as alkyl crotonates (e.g., butyl crotonate, hexyl crotonate, glycerol monocrotonate, etc.).

Next, specific compounds having two or more unsaturated bonds capable of addition polymerization are illustrated. These compounds are preferred for use in the present invention over those with one unsaturated bond. Such compounds include, first of all, esters of acrylic and methacrylic acid comprising the polyacrylates or polymethacrylates of polyhydric alcohols (here, the term "poly" implies esters containing two or more acrylic or methacrylic residues). Suitable polyhydric alcohols include polyethylene glycol, polypropylene oxide, polybutylene oxide, polycyclohexene oxide, polyethylene oxide-propylene oxide, polystyrene oxide, polyoxetane, polytetrahydrofuran, cyclohexanediol, xylylene-diol, di-(β-hydroxyethoxy)benzene, glycerol, diglycerol, neopentyl glycol, trimethylolpropane, triethylolpropane, pentaerythritol, dipentaerythritol, sorbitan, sorbitol, butanediol, 2-butene-1,4-diol, 2-n-butyl-2-ethylpropanediol, 2-butyne-1,4-diol, 3-chloro-1,2-propanediol, 1,4-cyclohexanedimethanol, 3-cyclohexene-1,1-dimethanol, decalindiol, 2,3-dibromo-2-butene-1,4-diol, 2,2-diethyl-1,3-propanediol, 1,5-dihydroxy-1,2,3,4-tetrahydronaphthalene, 2,5-diphenyl-1,3-propanediol, dodecanediol, mesoerythritol, 2-ethyl-1,3-hexanediol, 2-ethyl-2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethyl resorcinol, 2-methyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-α,α-diol, 1,1.4,4-tetraphenyl-1,4-butanediol, 1,1,4,4-tetraphenyl-2-butyne-1,4-diol, 1,2,6-trihydroxyhexane, 1,1'-methylenedi-2-naphthol, 1,2,4-benzenetriol, biphenol, 2,2'-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzyl alcohol, methylhydroquinone, methyl-2,4,6-trihydroxybenzoate, phloroglucinol, pyrogallol, resorcinol, glucose, α-(1-aminoethyl)-p-hydroxybenzyl alcohol, 2-amino-2-ethyl-1-,3-propanediol, 2-amino-2-methyl-1,3-propanediol, 3-amino-1,2-propanediol, N-(3-aminopropyl)-diethanolamine, N,N'-bis-(2-hydroxyethyl)piperazine, 2,2-bis(hydroxymethyl)-2,2',2''-nitrilotriethanol, 2,2-bis(hydroxymethyl)propionic acid, 1,3-bis(hydroxymethyl)urea, 1,2-bis(4-pyridyl)-1,2-ethanediol, N-n-butyldiethanolamine, diethanolamine, N-ethyldiethanolamine, 3-mercapto-1,2-propanediol, 3-piperidino-1,2-propanediol, 2-(2-pyridyl)-1,3-propanediol, triethanolamine, α-(1-aminoethyl)-p-hydroxybenzyl alcohol, 3-amino-4-hydroxyphenylsulfone, etc. Of these acrylic and methacrylic esters, the following ones are most preferred because of their commercial availability: ethylene glycol diacrylate, diethylene glycol dimethacrylate, polyethylene glycol diacrylate, pentaerythritol triacrylate, pentaerythritol dimethacrylate, dipentaerythritol pentaacrylate, glycerol triacrylate, diglycerol dimethacrylate, 1,3-propanediol diacrylate, 1,2,4-butanetriol trimethacrylate, 1,4-cyclohexanediol diacrylate, 1,5-pentanediol diacrylate, neopentyl glycol diacrylate, the triacrylate ester of the trimethylolpropane reaction product with ethylene oxide, etc.

On the other hand, acrylamide and methacrylamide compounds having two or more unsaturated bonds include: methylene-bis-acrylamide, methylene-bis-methacrylamide, and the polyacrylamides and polymethacrylamides of ethylenediamine, diaminopropane, diaminobutane, pentamethylenediamine, hexamethylene-bis(2-aminopropyl)amine, diethylenetriamine-diamine, heptamethylenediamine, octamethylenediamine, polyamines having a chain containing a hetero atom, and polyamines having a ring structure such as, for example, phenylenediamine, xylylenediamine, β-(4-aminophenyl)ethylamine, diaminobenzoic acid, diaminotoluene, diaminoanthraquinone, or diaminofluorene.

Allyl compounds include, for example, the diallyl esters of phthalic acid, terephthalic acid, sebacic acid, adipic acid, glutaric acid, malonic acid, or oxalic acid, and the diallyl esters or the diallylamides of disulfonic acids such as anthraquinonedisulfonic acid, benzenedisulfonic acid, 2,5-dihydroxy-p-benzenedisulfonic acid, dihydroxynaphthalenedisulfonic acid, naphthalenedisulfonic acid, etc.

Vinyl ether compounds are exemplified by the polyvinyl ethers of the above-described polyhydric alcohols, including ethylene glycol divinyl ether, 1,3,5-tri-β-vinyloxyethoxybenzene, glycerol trivinyl ether, etc.

Vinyl ester compounds include divinyl succinate, divinyl adipate, divinyl phthalate, divinyl terephthalate, divinylbenzene-1,3-disulfonate, divinylbutane-1,4-disulfonate, etc.

Styrene compounds include divinylbenzene, p-allylstyrene, p-isopropenestyrene, etc.

Those compounds which possess two or more unsaturated functional groups different from each other, including N-β-hydroxyethyl-β-(methacrylamide)ethyl acrylate, N,N-bis(β-methacryloxyethyl)acrylamide, or allyl methacrylate, can also advantageously used in the present invention.

Two or more of these monomers having unsaturated groups capable of addition polymerization can be used in combination. Such a monomer(s) can be incorporated in the recording layer in the range of from about 10 to 500, more preferably from 30 to 200, parts by weight per 100 parts by weight of the chlorinated polyolefin polymer binder.

Polymerization initiators which are already known in the art can be used in the present invention, including those described in J. Kosar, *Light Sensitive Systems*, chapter 5, such as carbonyl compounds, organic sulfur compounds, peroxides, redox initiators, azo and diazo compounds, halogen compounds, and photo-reducible dyestuffs. Typical examples are benzoin, benzoin methyl ether, benzophenone, 9,10-anthraquinone, 2-methyl-anthraquinone, 2-tert-butylanthraquinone, 9,10-phenanthrenequinone, diacetyl, benzil, and the compounds represented by the following general formula:

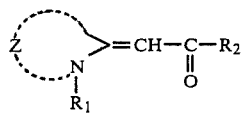

where, $R_1$ represents an alkyl group conventionally present in cyanine dyes, including an unsubstituted lower alkyl group such as, for example, methyl, ethyl, or propyl, a hyroxyalkyl group such as 2-hydroxyethyl, an alkoxyalkyl group such as 2-methoxyethyl, a carboxyalkyl group such as carboxymethyl, or 2-carboxyethyl, a sulfoalkyl group such as 2-sulfoethyl, or 3-sulfopropyl, an aralkyl group such as benzyl, phenethyl, p-sulfophenethyl or p-carboxyphenethyl, or a vinylmethyl group; $R_2$ represents, preferably, an alkyl group such as methyl, ethyl, propyl or other lower alkyl groups, an aryl group such as phenyl, p-hydroxyphenyl, p-methoxyphenyl, p-chlorophenyl, or naphthyl groups, or thienyl group; Z represents the non-metallic atom group necessary to complete a nitrogen-containing heterocyclic ring which is usually contained in cyanine dyes, including, for example, a benzothiazole nucleus such as benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole, 5,6-dimethoxybenzothiazole, etc., a naphthothiazole nucleus such as α-naphthothiazole, or β-naphthothiazole, a benzoselenazole nucleus such as benzoselenazole, 5-chlorobenzoselenazole, 6-methylbenzoselenazole, 6-methoxybenzoselanazole, etc., a naphthoselenazole nucleus such as α-naphthoselenazole, β-naphthoselenazole, etc., a benzoxazole nucleus such as benzoxazole, 5-methylbenzoxazole, 5-phenylbenzoxazole, 6-methoxybenzoxazole, etc., or a naphthoxazole nucleus such as α-naphthoxazole, β-naphthoxazole, etc.

Specific examples of the compounds described above are, for example, 2-benzoylmethylene-3-methyl-β-naphthothiazoline, 2-benzoylmethylene-3-ethyl-β-naphthothiazoline, 3-ethyl-2-(2-thenoyl)methylene-β-naphthiazoline, 3-ethyl-2-propionylmethylene-β-naphthotiazoline, 5-chloro-3-ethyl-2-p-methoxybenzoylmethylenebenzothiazoline, etc. Suitable organic sulfur compounds include di-n-butyl disulfide, di-n-octyl disulfide, dibenzyl disulfide, diphenyl disulfide, dibenzoyl disulfide, diacetyl disulfide, 2-mercaptobenzothiazole, 2-mercaptobenzoxazole, 2-mercaptobenzimidazole, thiophenol, thiocresol, p-methoxybenzenethiol, carboxymethyl-N,N-dimethyldithiocarbamate, ethyl trichloromethanesulfenate, etc.

Examples of peroxides are hydrogen peroxide, di-t-butyl peroxide, benzoyl peroxide, methyl ethyl ketone peroxide, etc.

Redox initiator systems are provided by the combinations of a peroxide with a reducing agent and include $Fe^{++}$ ion/hydrogen peroxide, $Fe^{++}$ ion/persulfate ion, $Fe^{+++}$ ion/peroxide, etc.

Azo and diazo compounds include α,α'-azobisisobutyronitrile, 2-azobis-2-methylbutyronitrile, 1-azo-bis-cyclohexanecarbonitrile, the diazonium salt of p-aminodiphenylamine, etc.

Examples of halogen compounds include chloromethylnaphthyl chloride, phenacyl chloride, chloroacetone, β-naphthalene sulfonyl chloride, xylene sulfonyl chloride, etc.

Suitable photo-reducible dyestuffs include rose bengal, erythrosine, eosine, acryflavine, riboflavine, thionine, etc.

The polymerization initiator suitably can be used in an amount of about 0.1 to 20 parts, more preferably, 1 to 10 parts per 100 parts by weight of the unsaturated monomer used.

Although the photo-polymerizable compositions in accordance with the present invention comprise mainly the ingredients described above, the compositions can also preferably contain a thermal polymerization inhibitor, which includes, for example, p-methoxyphenol, hydroquinone, alkyl or aryl substituted hydroquinones, t-butylcatechol, pyrogallol, cuprous chloride, phenothiazine, chloranil, naphthylamine, β-naphthol, 2,6-di-t-butyl-p-cresol, pyridine, nitrobenzene, dinitrobenzene, p-toluidine, methylene blue, the copper salt of an organic acid such as copper acetate, etc. Such as inhibitor can be used in the range of from about 0.001 to 5 parts by weight per 100 parts by weight of the unsaturated monomer used.

The photopolymerizable compositions of the present invention can further contain a coloring agent, plasticizer, resinous materials and other additives. Suitable coloring agents include, for example, pigments such as titanium dioxide, carbon black, ferric oxide, phthalocyanine pigments, azo pigments, and dyes such as methylene blue, crystal violet, rhodamine B, fuchsine, auramine, azo dyes and anthraquinone dyes. Of these, those are preferred which do not absorb light in the spectral region where light absorption by the polymerization initiator takes place. Such a coloring agent can be preferably used in an amount of about 0.1 to 30 parts by weight for the pigment and in an amount of about 0.01 to 10 parts by weight for the dyestuff per 100 total parts by weight of the polymer binder and the unsaturated monomer.

Suitable plasticizers include phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diaryl phthalate, etc., glycol esters such as dimethylglycol phthalate, ethylphthalylethyl glycolate, methylphthalylmethyl glycolate, butylphthalylbutyl glycolate, triethylene glycol dicaprylate, etc., phosphoric acid esters such as tricresyl phosphate, triphenyl phosphate, etc., aliphatic dicarboxylic acid esters such as diisobutyl adipate, dioctyl adipate, dimethyl sebacate, dibutyl sebacate, dioctyl azelate, dibutyl maleate, etc., and other esters such as triethyl citrate, the triacetyl ester of glycerol, and butyl laurate. A suitable amount of plasticizer ranges from about 0.1% to 20%, preferably 1 to 10% by weight.

Suitable resinous materials which can be present are rosin, xylene resins and polybutadiene in an amount ranging from about 1% to 30%, preferably 5 to 20% by weight to the total composition.

An epoxy resin as a stabilizer for the chlorinated polyolefin also can be suitably present in an amount of about 0.01% to 10%, preferably 0.1 to 5% by weight.

The photopolymerizable compositions used in the present invention are dissolved in suitable solvent systems to form a coating solution, which are coated on suitable supports and then dried.

Solvents which can be used to prepare coating solutions include ketones such as acetone, methyl ethyl ketone, methyl isobutyl ketone, cyclohexanone, diisobutyl ketone; esters such as ethyl acetate, butyl acetate, n-amyl acetate, methyl formate, ethyl propionate, dimethyl phthalate, ethyl benzoate, etc.; aromatic hydrocarbons such as toluene, xylene, benzene, ethylbenzene, etc.; halogenated hydrocarbons such as carbon tetrachloride, trichloroethylene, chloroform, 1,1,1-trichloroethane, monochlorobenzene, chloronaphthalene, etc.; ethers such as tetrahydrofuran, diethyl ether, ethylene glycol monomethyl ether, ethylene glycol monoethyl ether acetate, etc.; and nitrogen-containing and sulfur-containing solvents such as dimethylformamide and dimethylsulfoxide. On the surface of the support another coating can be provided in order to improve the adhesion of the photosensitive coating to the support, if desired, or an anti-halation coating. A suitable coating solution concentration can range from about 1 to 60%, preferably 10 to 40%, by weight on a solids basis.

The suppport which is used in the present invention must have a good light transmittancy as well as a sufficiently uniform surface structure. Suitavle supports include a variety of plastic films such as polyethylene terephthalate, polypropylen, polyethylene, cellulose triacetate, cellulose diacetate, poly(vinyl chloride), poly(vinyl alcohol), polycarbonate, polystyrene, cellophane, vinylidene chloride copolymers, polyamide, polyimide, vinyl chloride-vinyl acetate copolymers, poly(tetrafluoroethylene), poly(trifluoroethylene), etc. In addition, composite materials comprising two or more of these plastic materials can also be used.

The support usually has a thickness of from about 10 to 150 microns, preferably 10–100 microns, and more preferably from 20 to 50 microns. However, those with a thickness greater or smaller than the above limits can also be used.

The thickness of the photopolymerizable layer provided on the support is determined so that the image ultimately obtained satisfies the desired function, and generally a suitable of thickness is between about 5 and 100 microns and, more preferably between 10 and 60 microns.

The recording material prepared according to the present invention comprises a support and a photopolymerizable layer provided on the support, however, a protective overlying film can be provided on the photopolymerizable layer, if desired. Suitable materials for such a protective film include those illustrated as being suitable for the support as well as paper and paper laminated with polyethylene or polypropylene. The covering film can be in general about 8 to 80 microns thick, and, more preferably, 10 to 50 microns thick. In the selection of the support and the cover film, the adhesive strength A between the photopolymerizable layer and the support needs to be made greater than the adhesive strength B between the photopolymerizable layer and the cover film. This condition can be satisfied, for example, by using the following combinations of support and cover (protective) film as shown in Table 1.

TABLE 1

| Combination | Support | Protective Film |
|---|---|---|
| 1 | Polyethylene Terephthalate | Polypropylene |
| 2 | Polyethylene Terephthalate | Polyethylene |
| 3 | Polyamide (6-Nylon) | Polyethylene |
| 4 | Polyvinyl Chloride | Cellophane |
| 5 | Polyimide | Polypropylene |

Instead of using different materials as a support and a protective film, the adhesion requirement can also be satisfied by surface treatment of either the support or the protective film. Such surface treatment made on the support, which is generally carried out to improve the adhesion of the photopolymerizable composition layer to the support, includes the coating of a subbing layer, a corona discharge treatment, a flame treatment, an irradiation with ultraviolet light, an irradiation with high frequency waves, a glow discharge treatment, an active plasma treatment or an irradiation with the radiation of a laser.

On the protective film, on the contrary, the surface treatment is effected in order to reduce the adhesion between the photopolymerizable composition layer and the protective film and such treatments include subbing with a polyorganosiloxane, a fluorinated polyolefin, or a polyfluoroethylene.

The image forming processes utilizing the recording materials of the present invention will be explained in greater detail in the following.

Where the recording material in accordance with the present invention possesses a protective film, the photopolymerizable layer is, after the protective film has been peeled off, brought into intimate contact under pressure with a substrate. Then, image exposure is carried out through the transparent support. A light source emitting a sufficient amount of light in a wavelength ranging from about 350 to 450 m$\mu$ is advantageously used, such as, for example, a mercury lamp, a xenon lamp, a carbon arc lamp or a fluorescent lamp for duplication use. In addition, laser beams, electron beams or X-rays can be used. The exposure time will, of course, vary depending on the light source, but generally a suitable exposure time to a 1 kw light source at a distance of 30 cm can range from about 30 seconds to 5 minutes. After the image exposure, the support is peeled off whereby the exposed area of the photopolymerizable layer remains on the substrate and the non-exposed area is removed together with the support, thus leaving an image on the substrate.

The photopolymerizable composition of the present invention can be advantageously used in the fields of photography, photo copying, producing of relief patterns, offset printing, and gravure printing, but it is most advantageously used in the formation of resist images.

The recording material in accordance with the present invention can be used to form an image with a higher resolution compared with those obtained using conventional materials. Thus, reproduction of minute patterns can be very accurately carried out. Moreover, images obtained using the recording material of the present invention are superior in the resistance to abrasion as well as to chemicals, thus showing excellent suitability for the formation of resist images. In the following the present invention will be explained in further detail illustrating specific examples, which are given for the purpose of illustration and not for the purpose of limiting the scope of the present invention. In the examples, all percents, ratios and the like are by weight if not otherwise designated.

EXAMPLE 1

A photosensitive composition liquid was prepared with the following ingredients;

| | |
|---|---|
| Chlorinated Polyethylene (CPE-907LTA, trade name, produced by Sanyo Kokusaku Pulp Co., $[\eta] = 0.105$ in benzene at 30° C.; degree of chlorination = 70% by weight) | 50 g |
| Trimethylolpropane Triacrylate | 40 g |
| 2-Methylanthraquinone | 4 g |
| Pigment (Microlith Red RT, trade name, produced by Ciba Ltd.) | 0.1 g |
| p-Methoxyphenol | 0.2 g |

These solid ingredients were added to 300 ml of methyl ethyl ketone to provide a coating solution which was coated uniformly on the anodized surface of an aluminum plate using a whirler uniformly. The coating was dried at 80° C. for 15 minutes. The thickness of the coating was 2 microns. Then, an image exposure was carried out in a vacuum printing frame using a 2 kw mercury lamp as a light source and a negative original containing alphabetic images therein as an original. The distance from the light source to the photosensitive material was 30 cm and the exposure time was 30 seconds. Then the material was subjected to spray development using a developer liquid comprising a 2:1 by volume mixture of methanol and methyl ethyl ketone whereby the non-photopolymerized portion of the photosensitive coating was selectively removed. A clear and distinct positive image corresponding to the original image resulted. The image exhibited a sufficient degree of oleophilic property, showing good receptivity to printing inks when used for printing.

EXAMPLE 2

The photosensitive coating mixture described in Example 1 was spray coated on a zinc plate for a letterpress printing master, and dried. The thickness of the coating was 20 microns and the coating had a clear appearance with no phase separation. After a polyethylene terephthalate film 25 microns thick was lightly laminated on the photosensitive coating, an image exposure was carried out through a silver halide photographic film original carrying therein a half-toned image, with a distance of 70 cm to a 1000 watt carbon arc lamp for 60 seconds. Development was carried out with the same developing liquid as described in Example 1 to give a sharp image on the zinc plate. Then etching was carried out using a 10% aqueous nitric acid solution, during which time the photopolymerized resist image remained firmly bonded onto the zinc plate surface without any tendency to peel away. A printing master for letterpress use was obtained by removing the resist image with methylene chloride.

EXAMPLE 3

A coating comprising the following ingredients was prepared in the manner described below.

| | |
|---|---|
| Chlorinated Polypropylene (CPP-406, trade name, product of Sanyo Kokusaku Pulp Co., $[\eta] = 0.100$ in benzene at 30° C.; degree of chlorination = 68% by weight) | 20 g |
| Pentaerythritol Triacrylate | 30 g |
| 2-t-Butylanthraquinone | 0.3 g |
| Methylene Blue | 0.1 g |
| Hydroquinone | 0.1 g |

Of these ingredients, methylene blue was dissolved in 1 ml of ethanol, while the remaining ingredients were dissolved in 50 ml of trichloroethylene, and the two solutions were mixed to give a viscous, colored photosensitive coating mixture. A support was prepared by placing a nylon screen mesh on a 25 micron thick polyethylene terephthalate film. On this support the coating mixture was coated on the mesh placed side, and then dried at 70° C. for 10 minutes. By overlaying on the photosensitive coating another film of polyethylene terephthalate, an assembly of multi-layer structure in which the nylon screen mesh and the photosensitive composition were sandwiched resulted. The thickness of the photosensitive coating was about 100 microns including the nylon screen mesh. After an image exposure was carried out through a positive original in a printer installed with fluorescent lamps (Plano PS-Printer-A3, trade name, a product of Fuji Photo Film Co., Ltd.) for 1 minute, the two polyethylene terephthalate films were separated whereby the unexposed portion of the photosensitive composition was removed and only the exposed portion which had been cured by light remained on the nylon screen mesh. The screen thus obtained could be used as is as a master for mimeograph printing.

EXAMPLE 4

A photosensitive coating mixture comprising the following ingredients was coated using whirler coating on a cleaned copper substrate for printed circuit use so as to give a dried thickness of about 20 microns.

| | |
|---|---|
| Chlorinated Polyethylene (Elaslen-401A, a trade name, a product of Showa Denko Ltd.)* | 20 g |
| Glycelol Triacrylate | 20 g |
| 1-Methyl-2-benzoylmethylene-$\beta$-naphthothiazoline | 0.4 g |
| p-Methoxyphenol | 0.2 g |
| Pigment (Microlith Blue 4GA, a product of CIBA Co.) | 0.1 g |
| Methyl Ethyl Ketone | 100 ml |

*Elaslen-401A has a chlorine content of 40% by weight, a density of 1.20 g/cm³ and a Mooney viscosity of 80 (MS4' 100° C.).

On this coating was provided an oxygen impervious layer by overcoating a 2% aqueous solution of polyvinylpyrrolidon (molecular weight about 40,000) to give a dried thickness of about 1 micron. After an image exposure was carried out in the same manner as described in Example 1 using a negative circuit pattern original, development was conducted by spraying a developer comprising a 2:1 by volume mixture of ethyl alcohol and methyl ethyl ketone onto the surface, which gave a photoresist pattern. Etching was then carried out with a ferric chloride solution (40° Be') at 40° C. for 5 minutes to etch the copper. A printed circuit pattern resulted with an improved degree of side etching.

EXAMPLE 5

The following ingredients;

| | |
|---|---|
| Chlorinated Polyethylene (CPE-907MAI, trade name, a product of Sanyo Kokusaku Pulp Co., $[\eta] = 0.174$ in benzene at 30° C.; degree of chlorination = 72% by weight) | 10 g |
| Pentaerythritol Dimethacrylate | 16 g |
| 2-t-Butylanthraquinone | 0.3 g |
| Hydroquinone | 0.1 g |
| Pigment (Microlith Blue-4GK, trade name, a product of Ciba Ltd.) | 0.3 g | were dissolved in a mixture of 100 ml methyl ethyl ketone and 20 ml dimethylformamide to provide a photosensitive coating solution. A part of this solution was coated on a 25 micron thick polyethylene terephthalate film using a coating rod to a dried thickness of 15 microns and dried at 80° C. for 20 minutes. Then the coating was laminated under pressure onto a cleaned copper substrate for printed circuit use. The resulting assembly was exposed to a negative printed circuit pattern using a 2 kw mercury lamp for 1 minute. Immediately after the exposure, the polyethylene terephthalate cover film was peeled off whereby a photopolymerized positive image was formed on the copper substrate and the complementary portion which was not photopolymerized was removed together with the cover film. The image bearing copper substrate was subjected to an etching operation using a 40° Be' ferric chloride aqueous solution at 40° C. as described in Example 4. During the etching operation, the photosensitive coating remained firmly adhered onto the copper surface, thus showing no tendency at all toward peeling off or formation of pinholes. The removal of the polymerized image was readily accomplished using methylene chloride. It proved that the composition of the present example is superior in the ease of the removal of the resist to many conventional photo resist films such as Riston, trade name, a product of DuPont Co., which has the disadvantage of difficulty in the removal of the resist image.

EXAMPLE 6

| | |
|---|---|
| Chlorinated Polyethylene (Superchlone CPE-907LTA, trade name, a product of Sanyo Kokusaku Pulp Co.)* | 10 g |
| Pentaerythritol Dimethacrylate | 10 g |
| 2-Methylanthraquinone | 0.2 g |
| Hydroquinone | 0.1 g |
| Copper Phthalocyanine Pigment | 0.2 g |

*A 40 weight % toluene solution of Superchlone CPE-907LTA has a viscosity of about 90 cps at 25° C. and Superchlone has a chlorine content of more than 66 weight %.

The above ingredients were dissolved in a mixture of 100 ml of methyl ethyl ketone and 20 ml of dimethylformamide to provide a photosensitive coating solution. Part of this solution was coated using a coating rod onto a 25 micron thick polyethylene terephthalate film, which was dried at 80° C. for 20 minutes. The thickness of the coating was 15 microns after drying. The coating was then laminated under pressure onto a cleaned copper substrate for printed circuit use. The laminated assembly was exposed to light from a 2 kw mercury lamp through a negative original for 1 minute. Immediately after the exposure, the polyethylene terephthalate film was peeled off from the assembly whereby the unhardened area of the photosensitive coating was removed together with the polyethylene terephthalate film, thus leaving a photopolymerized positive image on the copper substrate. The copper substrate was subjected to etching with a 40° Be' ferric chloride aqueous solution at 40° C. During this operation, no tendency toward peeling or pinhole generation of the image was observed, since the photosensitive cured coating firmly adhered onto the copper surface. The image could easily be removed with methylene chloride after etching. A conventional photoresist film such as Riston gave an image which was difficult to remove at the final procedure after etching. This means that the composition of the present invention is superior to such a conventional composition in respect to the ease of image removal.

EXAMPLE 7

The photosensitive coating mixture described in Example 1 was coated on a 30 micron thick polypropylene film in a similar manner to that of Example 1 to provide a dried thickness of 20 microns. This material was laminated onto a cleaned flexible copper plate under pressure. Using a negative original containing circuit pattern information, exposure was made through the polypropylene film with a carbon arc separated by a distance of 50 cm for 40 seconds. Without delay, the polypropylene film was removed off from the photosensitive coating, which operation provided a clear and distinct photoresist pattern comprising the photopolymerized coating on the flexible copper substrate. On the other hand, the non-irradiated, non-polymerized area was removed adhering to the polypropylene film. The resist pattern thus obtained could resolve fine lines with a 100 micron width and could withstand a subsequent etching operation using a 40° Be' ferric chloride aqueous solution.

EXAMPLE 8

The following ingredients,

| | |
|---|---|
| Chlorinated Polypropylene (Superchlone CPP-306, trade name, a product of Sanyo Kokusaku Pulp Co.)* | 20 g |
| Trimethylolpropane Triacrylate | 30 g |
| 2-t-Butylanthraquinone | 0.3 g |
| Methylene Blue | 0.1 g |
| Hydroquinone | 0.1 g |

*Superchlone CPP-306 has a chlorine content not less than 66% by weight and a viscosity of about 95 cps at 25° C. when dissolved in toluene to make a 40% by weight solution.

were dissolved in 50 ml of ethylene chloride except the methylene blue which was dissolved in 1 ml of ethanol. The two solutions were mixed together to provide a colored viscous solution. This solution was uniformly coated on a 25 micron thick polyethylene terephthalate film and the coating was then dried. The thickness of the coating was 10 microns. A 20 micron thick polyethylene film was superimposed on the surface of this coating. The assembly was stored under ordinary conditions. Observation after one month proved that no degradation had occurred. After removal of the polyethylene film, the coating was laminated at room temperature onto a copper plate for printed circuit use. An image exposure was made through a negative original using a 2 kw mercury lamp for 40 seconds, and after the exposure the polyethylene terephthalate film was peeled off, giving a high quality resist pattern. This resist pattern was exactly equivalent to that obtained by processing the same material immediately after the manufacture as to image quality, and uniformity. Also no reduction in photographic speed was observed at all. The image bearing copper plate was etched with an etching solution mainly comprising ammonium persulfate. To this etching operation, the resist pattern could perfectly withstand, showing good etch resistance as well as an improved side-etching performance.

EXAMPLE 9

The photosensitive coating coated on a 25 micron thick polyethylene terephthalate film prepared in a similar manner to that described in Example 1 was laminated on a copper substrate for printed circuit use. (The coating thickness on dry basis was 30 microns.) In contrast to Example 1, a positive original was used in the image exposure, which was carried out using a 2 kw mercury lamp at a distance of 40 cm and an exposure time of 40 seconds, immediately followed by peeling off of the polyethylene terephthalate film. A negative resist pattern comprising the photopolymerized coating appeared on the copper plate. The exposed copper surface was then subjected to solder plating in the following way.

The plating bath.

| | |
|---|---|
| Sn(BF$_4$)$_2$ (45% aqueous solution) | 300 g |
| Pb(BF$_4$)$_2$ (45% aqueous solution) | 100 g |
| HBF$_4$ (42% aqueous solution) | 220 g |
| H$_3$BO$_3$ | 28 g |
| Water to make | 100 |

A solder rod comprising a 6:4 by weight mixture of tin and lead was used as the positive pole, and the plating conditions were; the temperature of the bath=30° C., the current density at the negative pole=3.0 amperes/dm$^2$, and the plating period=30 minutes. A good solder layer was plated, and the resist was not removed nor were any pinholes generated. By immersing the copper substrate in methyl ethyl ketone, the resist image could be easily removed. Then etching was carried out with a 20% ammonium persulfate aqueous solution, which ultimately provided a circuit pattern plated with solder.

EXAMPLE 10

The following solution was prepared.

| | |
|---|---|
| Chlorinated Polyethylene (Erathrene-401A, trade name, a product of Showa Denko Ltd.)* | 15 g |
| Diglycerol Trimethacrylate | 25 g |
| 1-Methyl-2-benzoylmethylene-β-naphthothiazoline | 0.5 g |
| p-Methoxyphenol | 0.2 g |
| Carbon Black (mean particle diameter 20 millimicrons) | 0.2 g |
| Methyl Ethyl Ketone | 100 ml |

*Erathrene-401A has a chlorine content of 40%, a density of 1.20 g/cm$^3$ and a Mooney viscosity of 80 (MS4' 100° C.).

The solution of the above composition was coated on a polyethylene terephthalate film and then dried at 80° C. for 10 minutes. The dried coating was pressed onto a copper substrate for printed circuit use at room temperature. Subsequent procedures were carried out in the similar manner as described in Example 4 to form a resist pattern for plating. Tin plating was performed on the copper not covered by the resist whereby the resist image was firmly bonded to the copper surface even in the plating bath and no peeling was observed.

EXAMPLES 11-13

A resist pattern was formed on a copper plate in a similar manner to that described in Example 1, except that in the photopolymerizable composition the amount of chlorinated polyethylene was varied using 15, 20 and 30 g, respectively. In all cases, a good quality image was obtained as in Example 1.

COMPARATIVE EXAMPLES 1-4

In each of Examples 1 and 6-8, the chlorinated polyethylene was replaced by polymethyl methacrylate (Torex-G, trade name, a product of Toray Co., [η]=0.310 at 30° C. in methyl ethyl ketone).

In each case, it was impossible to form a clear and sharp image, and the quality of the image obtained was far inferior to the images obtained using recording materials prepared according to the present invention.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition consisting essentially of:
   (a) a chlorinated polyolefin binder having a degree of polymerization ranging from 300 to 20,000 and a degree of chlorination ranging from about 40 to 72% selected from the group consisting of chlorinated polyethylene, chlorinated polypropylene and chlorinated copolymer of poly(ethylene/propylene);
   (b) a monomer which is an ester of acrylic acid and a polyhydric alcohol or an ester of methacrylic acid and a polyhydric alcohol, said monomer having at least one ethylenically unsaturated bond capable of addition polymerization present in an amount of 8.0 to 26.7 parts by weight per 10 parts by weight of said polyolefin (a); and
   (c) a photopolymerization initiator present in an amount of 0.1 to 1 parts by weight per 100 parts by weight of said monomer (b).

2. The photopolymerizable composition of claim 1, wherein said photopolymerization initiator is benzoin, benzoin methyl ether, benzophenone, 9,10-anthraquinone, 2-methylanthraquinone, 2-tert-butylanthraquinone, 9,10-phenanthrenequinone, diacetyl, benzil, or a compound represented by the following general formula:

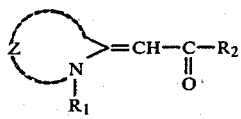

wherein, R$_1$ represents an alkyl group, a hydroxyalkyl group, an alkoxyalkyl group, a carboxyalkyl group, a sulfoalkyl group, an aralkyl group, a sulfoaralkyl group, a carboxyaralkyl group or a vinylmethyl group; R$_2$ represents an alkyl group, an aryl group, a hydroxyaryl group, an alkoxyaryl group, a haloaryl group, or a thienyl group; Z represents the non-metallic atom group necessary to complete a nitrogen-containing heterocyclic ring, an organic sulfur compound, a peroxide, a redox initiator, an azo compound, a diazo compound, an active halogen containing compound, or a photo-reducible dyestuff.

3. The photopolymerizable composition of claim 1, wherein said chlorinated polyolefin is chlorinated polyethylene.

4. The photopolymerizable composition of claim 1, wherein said chlorinated polyolefin is chlorinated polypropylene.

5. The photopolymerizable composition of claim 1, which is suitable for peeling-off development.

6. The photopolymerizable composition of claim 3, which is suitable for peeling-off development.

7. The photopolymerizable composition of claim 1, wherein said photopolymerization initiator is 2-methylanthraquinone, 2-tert-butylanthraquinone or 1-methyl-2-benzoylmethylene-β-naphtho-thiazoline.

8. The photopolymerizable composition of claim 1, wherein said monomer (b) is an ester of acrylic acid and a polyhydric alcohol.

9. The photopolymerizable composition of claim 1, wherein said monomer (b) is trimethylolpropane triacrylate, pentaerythritol triacrylate or glycerol triacrylate.

10. The photopolymerizable composition of claim 1, wherein said monomer (b) is an ester of methacrylic acid and a polyhydric alcohol.

11. The photopolymerizable composition of claim 1, wherein said monomer (b) is pentaerythritol dimethacrylate or diglycerol trimethacrylate.

12. An image recording material comprising a support having thereon a layer of the photopolymerizable composition of claim 1.

13. The image recording material of claim 12, including a protective film on said photopolymerizable composition layer.

14. The image recording material of claim 12, wherein said support is a transparent support.

15. The image recording material of claim 12, wherein said support is polyethylene terephthalate, polypropylene, a polyamide or a polyimide.

16. The image recording material of claim 12, wherein said photopolymerizable composition layer has a thickness ranging from about 2 to 100 microns.

17. The photopolymerizable composition of claim 1, including at least one member selected from the group consisting of a thermal polymerization inhibitor, a coloring agent, a plasticizer, a resinous material and a stabilizer for said chlorinated polyolefin.

18. The image recording material of claim 12, wherein said support is an aluminum plate, a zinc plate or a copper plate.

19. The image recording material of claim 12, wherein said support is a metal support.

20. The image recording material of claim 18, wherein said aluminum plate has an anodized surface.

21. The image recording material of claim 18, wherein said copper plate is a copper substrate for printed circuit.

22. The image recording material of claim 14, wherein said transparent support has a thickness ranging from about 10 to 100 microns.

23. The image recording material of claim 13, wherein said protective film is polypropylene, polyethylene, cellulose triacetate, cellulose diacetate, poly(vinyl chloride), poly(vinyl alcohol), a polycarbonate, polystyrene, cellophane, a vinylidene chloride copolymer, a vinyl chloride-vinyl acetate copolymer, poly(tetrafluoroethylene) or poly(trifluoroethylene).

24. The image recording material of claim 15, wherein said protective film is a polyvinylpyrrolidone film provided by coating on said photopolymerizable composition layer, or a polyethylene film.

25. The image recording material of claim 14, wherein said transparent support is a polyethylene terephthalate film or a polypropylene film.

26. The image recording material of claim 12, wherein said photopolymerization initiator is benzoin, benzoin methyl ether, benzophenone, anthraquinone, 9,10-anthraquinone, 2-methylanthraquinone, 2-tert-butylanthraquinone, 9,10-phenanthrenequinone, diacetyl, benzyl, or a compound represented by the following general formula:

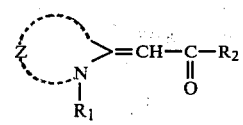

wherein, $R_1$ represents an alkyl group, a hydroxyalkyl group, an alkoxyalkyl group, a carboxyalkyl group, a sulfoalkyl group, an aralkyl group, a sulfoaralkyl group, a carboxyaralkyl group or a vinylmethyl group; $R_2$ represents an alkyl group, an aryl group, a hydroxyaryl group, an alkoxyaryl group, a haloaryl group, or a thienyl group; Z represents the non-metallic atom group necessary to complete a nitrogen-containing heterocyclic ring, an organic sulfur compound, a peroxide, a redox initiator, an azo compound, a diazo compound, an active halogen containing compound, or a photo-reducible dyestuff.

27. The image recording material of claim 12, wherein said photopolymerization initiator is 2-methylanthraquinone, 2-tert-butylanthraquinone or 1-methyl-2-benzoylmethylene-β-naphtho-thiazoline.

28. The image recording material of claim 12, wherein said monomer (b) is an ester of acrylic acid and a polyhydric alcohol.

29. The image recording material of claim 12, wherein said monomer (b) is trimethylolpropane triacrylate, pentaerythritol triacrylate or glycerol triacrylate.

30. The image recording material of claim 12, wherein said monomer (b) is an ester of methacrylic acid and a polyhydric alcohol.

31. The image recording material of claim 12, wherein said monomer (b) is pentaerythritol dimethacrylate or diglycerol trimethacrylate.

32. The image recording material of claim 12, including at least one member selected from the group consisting of a thermal polymerization inhibitor, a coloring agent, a plasticizer, a resinous material and a stabilizer for said chlorinated polyolefin.

33. A peeling-off developable image recording material comprising (1) a copper, zinc or aluminum substrate having thereon; (2) a photopolymerizable composition layer consisting essentially of:
(a) a chlorinated polyolefin binder having a degree of polymerization ranging from 300 to 20,000 and a degree of chlorination ranging from about 40 to 72% selected from the group consisting of chlorinated polyethylene, chlorinated polypropylene and chlorinated copolymer of poly(ethylene/propylene)
(b) a monomer which is an ester of acrylic acid and a polyhydric alcohol or an ester of methacrylic acid and a polyhydric alcohol, said monomer having at least one ethylenically unsaturated bond capable of addition polymerization present in an amount of 8.0 to 26.7 parts by weight per 10 parts by weight of said polyolefin (a); and (c) a photopolymerization initiator present in an amount of 0.1 to 1 parts by weight per 100 parts by weight of said monomer (b).

34. The peeling-off developable image recording material of claim 33, wherein said photopolymerization initiator is benzoin, benzoin methyl ether, benzophenone, anthraquinone, 9,10-anthraquinone, 2-methylanthraquinone, 2-tert-butylanthraquinone, 9,10-phenanthrenequinone, diacetyl, benzyl, or a compound represented by the following general formula:

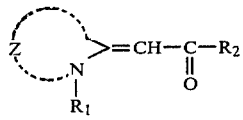

wherein, $R_1$ represents an alkyl group, a hydroxyalkyl group, an alkoxyalkyl group, a carboxyalkyl group, a sulfoalkyl group, an aralkyl group, a sulfoaralkyl group, a carboxyaralkyl group or a vinylmethyl group; $R_2$ represents an alkyl group, an aryl group, a hydroxyaryl group, an alkoxyaryl group, a haloaryl group, or a thienyl group; Z represents the non-metallic atom group necessary to complete a nitrogen-containing heterocyclic ring, an organic sulfur compound, a peroxide, a redox initiator, an azo compound, a diazo compound, an active halogen containing compound, or a photo-reducible dyestuff.

35. The peeling-off developable image recording material of claim 33, wherein said photopolymerization initiator is 2-methylanthraquinone, 2-tert-butylanthraquinone or 1-methyl-2-benzoylmethylene-$\beta$-naphtho-thiazoline.

36. The peeling-off developable image recording material of claim 33, wherein said monomer (b) is trimethylolpropane triacrylate, pentaerythritol triacrylate or glycerol triacrylate.

37. The peeling-off developable image recording material of claim 33, wherein said monomer (b) is an ester of methacrylic acid and a polyhydric alcohol.

38. The peeling-off developable image recording material of claim 33, wherein said monomer (b) is an ester of acrylic acid and a polyhydric alcohol.

39. The peeling-off developable image recording material of claim 33, including at least one member selected from the group consisting of a thermal polymerization inhibitor, a coloring agent, a plasticizer, a resinous material and a stabilizer for said chlorinated polyolefin.

40. The peeling-off developable image recording material of claim 33, wherein said photopolymerizable composition layer has a thickness ranging from about 2 to 100 microns.

41. The peeling-off developable image recording material of claim 33, wherein said aluminum substrate has an anodized surface.

42. The peeling-off developable image-recording material of claim 33, wherein said copper substrate is a copper substrate for printed circuit.

* * * * *